United States Patent
Yamasaki et al.

(10) Patent No.: US 6,594,167 B1
(45) Date of Patent: *Jul. 15, 2003

(54) SEMICONDUCTOR INTEGRATED CIRCUIT HAVING A STRUCTURE FOR EQUALIZING INTERCONNECTION LENGTHS AND MEMORY MODULE PROVIDED WITH THE SEMICONDUCTOR INTEGRATED CIRCUIT

(75) Inventors: Kyoji Yamasaki, Hyogo (JP); Takayuki Miyamoto, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,391

(22) Filed: Apr. 20, 2000

(30) Foreign Application Priority Data

Sep. 16, 1999 (JP) .......................................... 11-262427

(51) Int. Cl.⁷ ................................................. G11C 5/02
(52) U.S. Cl. ........................ 365/51; 365/63; 365/230.08
(58) Field of Search ....................... 365/230.03, 230.08, 365/51, 63

(56) References Cited

U.S. PATENT DOCUMENTS 5,604,710 A * 2/1997 Tomishima ............ 365/230.03
5,912,849 A * 6/1999 Yasu .......................... 365/195

* cited by examiner

Primary Examiner—Son T. Dinh
Assistant Examiner—Hien Nguyen
(74) Attorney, Agent, or Firm—McDermott, Will & Emery

(57) ABSTRACT

A memory chip includes a plurality of pins. The plurality of pins are divided into two rows for arrangement on the opposite sides of the memory chip. All data I/O pins are arranged on one side surface (in the same row) of a package. In the case of forming a memory module, each chip is arranged such that the data I/O pins may be nearest to a center line of a module substrate parallel to a connect pin group. Thereby, interconnections between the respective memory chips and the connect pins have substantially equal lengths.

14 Claims, 19 Drawing Sheets

SEMICONDUCTOR INTEGRATED CIRCUIT HAVING A STRUCTURE FOR EQUALIZING INTERCONNECTION LENGTHS AND MEMORY MODULE PROVIDED WITH THE SEMICONDUCTOR INTEGRATED CIRCUIT

BACKGROUND OF THE INVENTION

1. Field of the Invention

The invention relates to a semiconductor integrated circuit and a memory module, and particularly relates to a structure for equalizing lengths of interconnections of a plurality of data I/O (input/output) pins.

2. Description of the Background Art

In recent years, capacities of main memories of servers, work stations, personal computers and others have been increased, and consequently, there are increasing tendencies to increase capacities of memory modules (DIMMs: dual inline memory modules) forming the main memories.

The capacity of memory module can be increased, e.g., by increasing the memory capacities of Dynamic Random Access Memories (DRAMs) carried on the module, reducing a size of a package of each chip and thereby increasing the number of on-board chips, or employing a stack module structure.

Among the above, employment of the stack module is not technologically easy, and requires a high assembling cost. Further, it is expensive to increase the memory capacity of the on-board dynamic random access memory DRAM.

For the above reason, such a memory module has been developed that uses a conventional DRAM employing an inexpensive Thin Small Outline Package (TSOP) or an inexpensive Small Outline J-leaded package (SOJ) for increasing the number of on-board memory chips of the memory module.

The conventional memory module will now be described with reference to FIG. 20. The memory module shown in FIG. 20 includes a module substrate 90, a plurality of memory chips 91A–91F arranged on module substrate 90 and a connect pin group 92 arranged on one side of module substrate 90. Each of the plurality of memory chips 91A–91F is accommodated in a thin small outline package (TSOP). Each memory chip has a plurality of data I/O pins for transferring write data to be written into the memory cell array and read data read from the memory cell array. The plurality of data I/O pins are arranged on the opposite ends of the package (QX and QY). A 1st pin Q1 and a 1st pin Qi on the opposite side are provided for power supply.

The plurality of memory chips 91A–91C and the plurality of memory chips 91D–91F are arranged in two rows. Data is transmitted between a memory controller (not shown) and connect pin group 92. The memory chips operate in accordance with signals sent through connect pin group 92. Data I/O pin groups QX and QY of each of memory chips 91A–91F receive the write data from data I/O pin group included in connect pin group 92, and send the read data to the data I/O pin group included in connect pin group 92.

However, the conventional memory module suffers from such a problem that interconnections connecting the respective memory chips to connect pin group 92 have various lengths (interconnection lengths). For example, data I/O pin group QX of memory chip 91A and data I/O pin group QY of memory chip 91D are spaced from connect pin group 92 by different distances, respectively. Therefore, a data transfer time between memory chip 91D and the memory controller is longer than that between the memory chip 91A and the memory controller.

For eliminating the difference in data transfer time, the memory chips may be reduced in number. However, this cannot satisfy the demand for increased capacities.

For example, the interconnections between the memory chip 91A and the connect pin group 92 may be arranged in a folded fashion so that the interconnection length between data I/O pin group QX of memory chip 91A and connect pin group 92 may be equal to that between data I/O pin group QY of memory chip 91D and connect pin group 92. However, arrangement of such complicated interconnection patterns is difficult. Further, increase in interconnection length lowers the operation performance of memory chip 91A.

The above problem arises in connection with not only the data I/O pins but also signal pins in connect pin group 92 controlling internal operations of the memory chip.

According to JEDEC (Joint Electron Device Engineering Council) standards, it is specified as the standard to be satisfied that the data I/O pins and the predetermined signal pins in each memory chip must be connected to the connect pin group via interconnections of lengths equal to those for the other memory chips.

SUMMARY OF THE INVENTION

Accordingly, the invention provides a semiconductor integrated circuit, in which interconnections of equal lengths can be easily employed for predetermined pins when used in a memory module.

According to an aspect of the invention, a semiconductor integrated circuit includes a memory cell array including a plurality of memory cells arranged in rows and columns, an internal circuit for writing data into the memory cell array or reading data from the memory cell array, and a package including a plurality of pins and surrounding the memory cell array and the internal circuit. The plurality of pins are arranged on at least two surfaces forming the package. The plurality of pins include a plurality of data I/O pins for externally receiving the data to be written into the memory cell array and externally sending the data read from the memory cell array. All the plurality of data I/O pins are arranged at least one of the two surfaces.

Preferably, the plurality of pins further include a plurality of signal pins disposed on a surface opposed to the surface carrying all the plurality of data I/O pins for externally transmitting signals with respect to the internal circuit.

Preferably, the package is a thin small outline package (TSOP).

Preferably, the plurality of pins further include a control pin receiving a signal controlling a predetermined operation of the internal circuit, and the control pin is arranged on the surface carrying all the plurality of data I/O pins. Particularly, the package transmits signals to and from a plurality of connect pins arranged on a module substrate carrying the package, and the control pin is directly connected to a specific connect pin among the plurality of connect pins.

According to the semiconductor integrated circuit described above, since the data I/O pins are gathered on the one surface of the package, lengths of interconnections to the data I/O pins can be easily equalized in the memory module employing a plurality of circuits each formed of the above semiconductor integrated circuit.

An inexpensive thin small outline package (TSOP) may be used.

The specific pin and the data I/O pin may be arranged on the same surface so that lengths of interconnections to the specific pins can be easily equalized in the memory module employing a plurality of circuits each formed of the above semiconductor integrated circuit.

According to another aspect of the invention, a semiconductor integrated circuit includes a memory cell array including a plurality of memory cells arranged in rows and columns, an internal circuit for writing data into the memory cell array or reading data from the memory cell array, and a package including a plurality of data I/O pins for externally receiving the data to be written into the memory cell array and externally sending the data read from the memory cell array, and surrounding the memory cell array and the internal circuit, all the plurality of data I/O pins being arranged near one side forming an outer periphery of a predetermined surface of the package. Preferably, the package is a chip scale package (CSP), and all the plurality of data I/O pins are arranged on the same line.

According to the semiconductor integrated circuit described above, since the data I/O pins are gathered near one side forming the outer periphery of the one surface of the package, lengths of interconnections to the data I/O pins can be easily equalized in the memory module employing a plurality of circuits each formed of the above semiconductor integrated circuit. In particular, the chip scale package which is inexpensive can be used.

Still another object of the invention is to provide a memory module which can perform efficient data transmission without lowering an operation performance of a memory chip.

According to still another aspect of the invention, a memory module includes a connect pin group including a plurality of connect pins for externally transmitting signals, a plurality of memory chips operated by transmission of the signals with respect to the connect pin group, and a module substrate provided with the connect pin group, each of the plurality of memory chips having a memory cell array including a plurality of memory cells arranged in rows and columns, an internal circuit for writing data into the memory cell array or reading data from the memory cell array, and a package having a plurality of data I/O pins for externally receiving the data to be written into the memory cell array and externally sending the data read from the memory cell array, and surrounding the memory cell array and the internal circuit, all the plurality of data I/O pins being arranged on a predetermined surface of the package or in a portion neighboring to the predetermined surface and located in a surface in contact with the predetermined surface, the plurality of memory chips being divided into first and second chip rows for arrangement, and the plurality of memory chips being arranged such that each of the predetermined surfaces in the first row is opposed to the predetermined surface in the second chip row.

Preferably, the first and second chip rows are parallel to the connect pin group.

Preferably, the package is a thin small outline package TSOP, and all the plurality of data I/O pins are arranged on the predetermined surface.

Preferably, the package further includes a control pin arranged on the predetermined surface for receiving a signal controlling a predetermined operation of the internal circuit, and the control pin is directly connected to a specific connect pin among the plurality of connect pins.

Preferably, the package is a chip scale package CSP, and all the plurality of data I/O pins are arranged on the same line neighboring to the predetermined surface and located in the surface in contact with the predetermined surface.

Preferably, the plurality of data I/O pins are divided for arrangement in the portion neighboring to the predetermined surface and located in a first surface in contact with the predetermined surface and arrangement in the portion neighboring to the predetermined surface and located in a second surface in contact with the predetermined surface.

According to the memory module described above, the connect pins in the memory module and the data I/O pins of the respective memory chips can be arranged to employ interconnections of substantially equal lengths between them. Thereby, the data transmission can be performed efficiently without lowering the operation performance of the respective memory chips. Further, the JEDEC standards can be satisfied.

An inexpensive thin small outline package TSOP or an inexpensive chip scale package CSP may be used.

For specific pins, distances to the connect pin group can be substantially equal to each other. Thereby, a fast operation can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. The same components bear the same reference numbers, and description thereof will not be repeated.

[First Embodiment]

A memory chip of a first embodiment of the invention will now be described. The memory chip of the first embodiment of the invention has such a feature that a data I/O pin group DP for transmitting signals to and from a memory cell array is gathered on one end of the chip.

Figure 1:
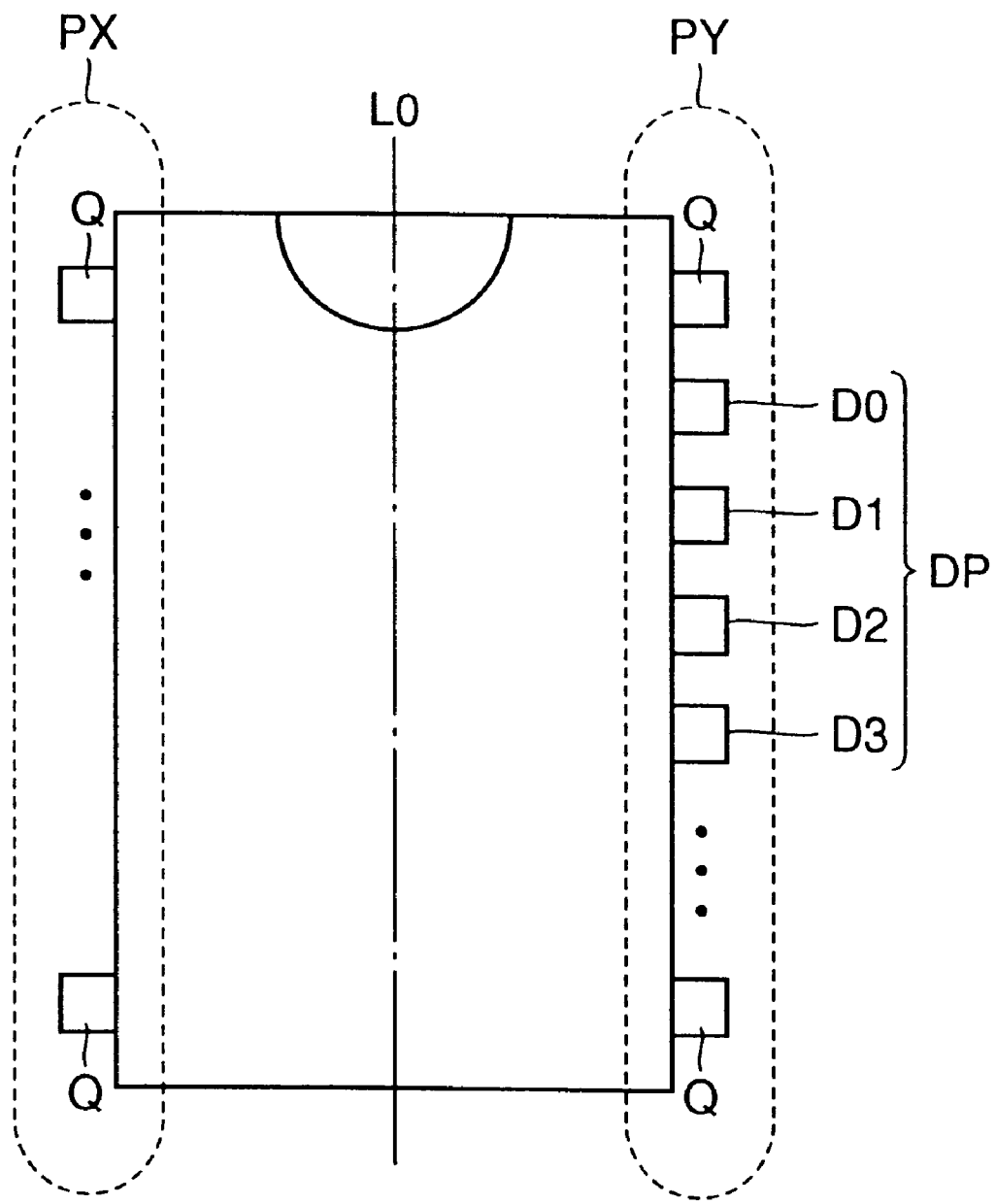
FIG. 1 shows a pin arrangement of a memory chip of a first embodiment of the invention.

FIG. 1 shows by way of example data I/O pins D0–D3 (data I/O pin group DP) arranged on a side of a chip 1. Characters Q represent pins other than data I/O pins DP, and more specifically represent pins such as an address pin receiving an address signal, a control signal pin receiving an external control signal and a power supply pin. Pins Q and data I/O pins D0–D3 form an interface region performing external signal transmission.

In the read operation, read data is externally issued from data I/O pin group DP. In the write operation, write data is received via data I/O pin group DP.

As shown in FIG. 1, these plurality of pins forming the interface region are arranged on the opposite sides of the chip. Therefore, it is easy to use a thin small outline package TSOP, in which pin rows PX and PY are arranged symmetrically with respect to a center line L0 of the package, and are located on the two opposite side surfaces, respectively. All the data I/O pins are arranged on one side surface.

The memory chip shown in FIG. 1 is a DRAM, a DRAM with an EDO (extended data output) mode, an SDRAM (synchronous DRAM) or the like. If the memory chip shown in FIG. 1 is the DRAM, it has a structure shown in FIG. 2.

Figure 2:
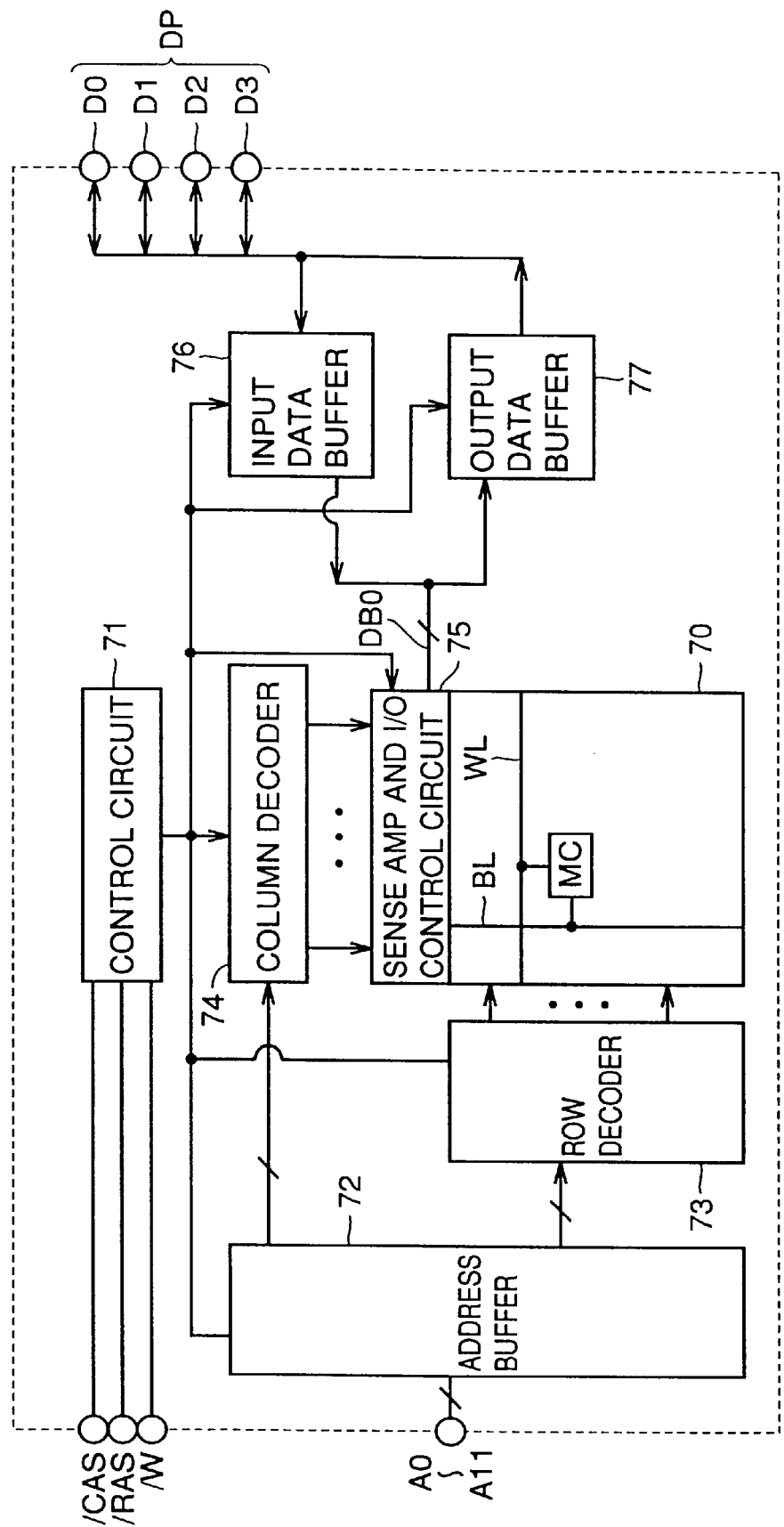
FIG. 2 shows the memory chip of the first embodiment of the invention.

The memory chip shown in FIG. 2 includes a memory cell array 70 which includes memory cells arranged in rows and columns, word lines WL corresponding to the rows, respectively, and bit lines BL corresponding to columns, respectively, a control circuit 71 which receives external control signals (e.g., a row address strobe signal /RAS, a column address strobe signal /CAS and a write enable signal /WE) from control signal pins, and issues internal control signals, an address buffer 72 which issues an internal row address and an internal column address in accordance with external address signals A0–A11 under the control of control circuit 71, a row decoder 73 which is controlled by control circuit 71 to decode the internal row address to select the row in memory cell array 70, and a column decoder 74 which is controlled by control circuit 71 to decode the internal column address and issue a column select signal for selecting the column in memory cell array 70.

The memory chip further includes sense amplifiers which sense and amplify data of the memory cells connected to the selected row in memory cell array 70, respectively, an I/O control circuit which connects the column selected in memory cell array 70 to an internal data bus DB0 in response to a column select signal sent from column decoder 74, an input data buffer 76 which is controlled in the write operation by control circuit 71 to produce internal write data from external write data applied to data I/O pin group DP (D0, D1, D2 and D3) and issue the internal write data onto internal data bus DB0, and an output data buffer 77 which is controlled in the read operation by control circuit 71 to produce external read data from internal read data read onto internal data bus DB0 and issue the external read data to data I/O pin group DP. In FIG. 2, the sense amplifiers and the I/O control circuit are depicted as one block 75.

In FIG. 2, control signal pins receiving signals /RAS, /CAS, /W and others as well as address pins receiving signals A0–A11 are arranged on the side opposite to data I/O pin group DP. However, the invention is not restricted to this structure.

Figure 3:
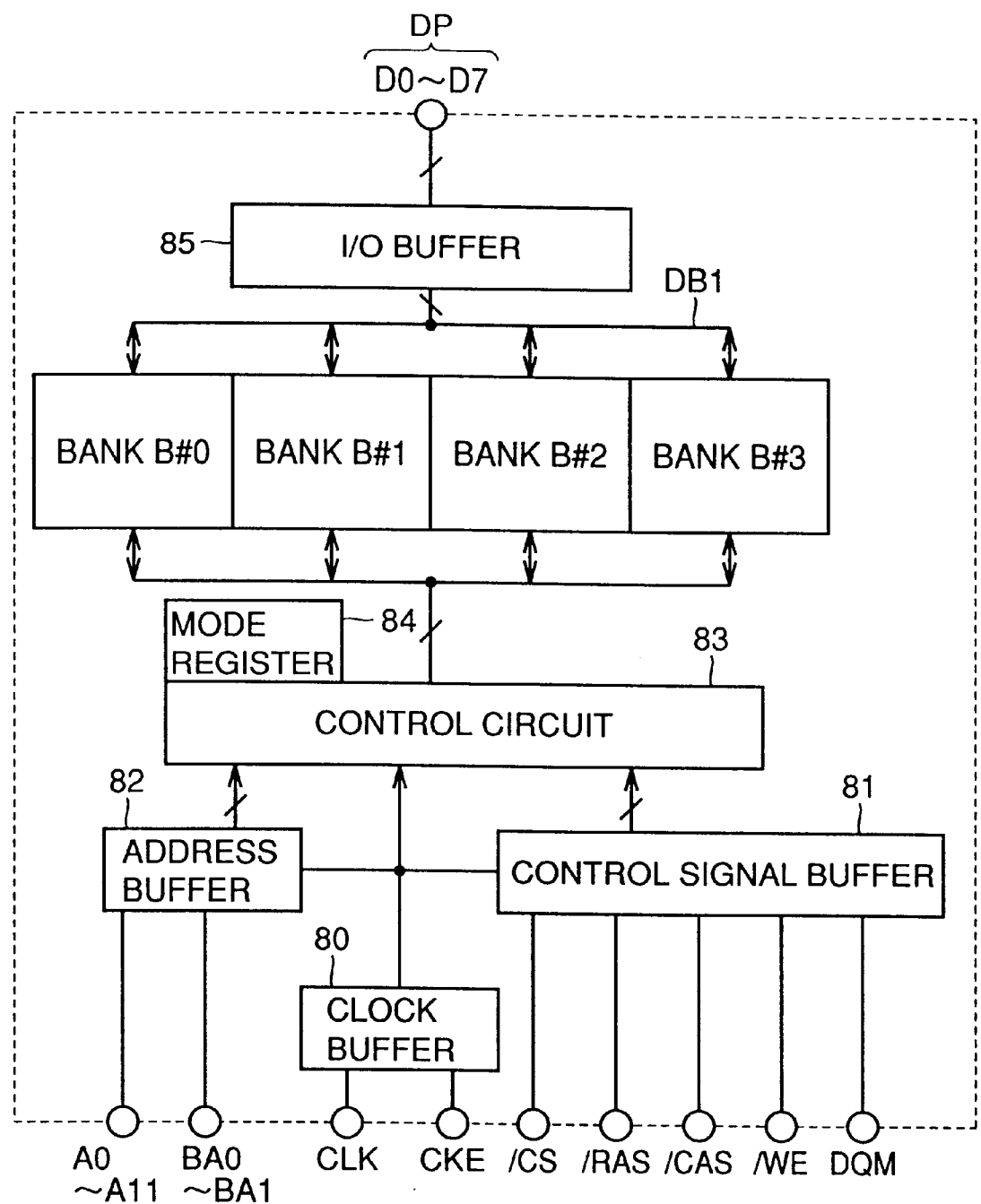
FIG. 3 shows another example of the memory chip of the first embodiment of the invention.

If the memory chip shown in FIG. 1 is an SDRAM, it has a structure shown in FIG. 3. The memory chip shown in FIG. 3 includes banks B#0–B#3 each including memory cells arranged in rows and columns, a clock buffer 80 which receives an external clock signal CLK and a clock enable signal CKE, and issue an internal clock signal, a control signal buffer 81 which operates in accordance with the internal clock signal to take in external control signals such as a chip select signal /CS, row address strobe signal /RAS, column address strobe signal /CAS, write enable signal /WE and an input-mask/output-disable signal DQM from the control signal pins, an address buffer 82 which takes in external address signals A0–A11 and external bank addresses BA0 and BA1 in accordance with the internal clock signal, and issues the internal address designating the memory cell to be selected, a control circuit 83 which operates in accordance with the internal clock signal to select the memory cell based on the outputs of control signal buffer 81 and address buffer 82, and execute writing/reading for the selected memory cell, a mode register 84 which is programmed to set a CAS latency, a burst length and others therein, and an I/O buffer 85 which operates in the write operation to produce the internal write data from the external write data applied from data I/O pin group DP (D0–D7), and issue the same onto an internal data bus DB1, and operates in the read operation to produce the external read data from the internal read data read onto internal data bus DB1 and issue the same to data I/O pin group DP.

The internal operation to be executed depends on a combination of row address strobe signal /RAS, column address strobe signal /CAS and write enable signal /WE. Each of banks B#0–B#4 can operate to drive the row to the selected state independently of the other banks.

In FIG. 3, the pins receiving signals /RAS, /CAS, /WE and others, the pins receiving signals A0–A11, BA0 and BA1, and the pins receiving signals CLK and CKE are arranged on the side opposite to data I/O pin group DP. However, the structure is not restricted to this.

Figure 4:
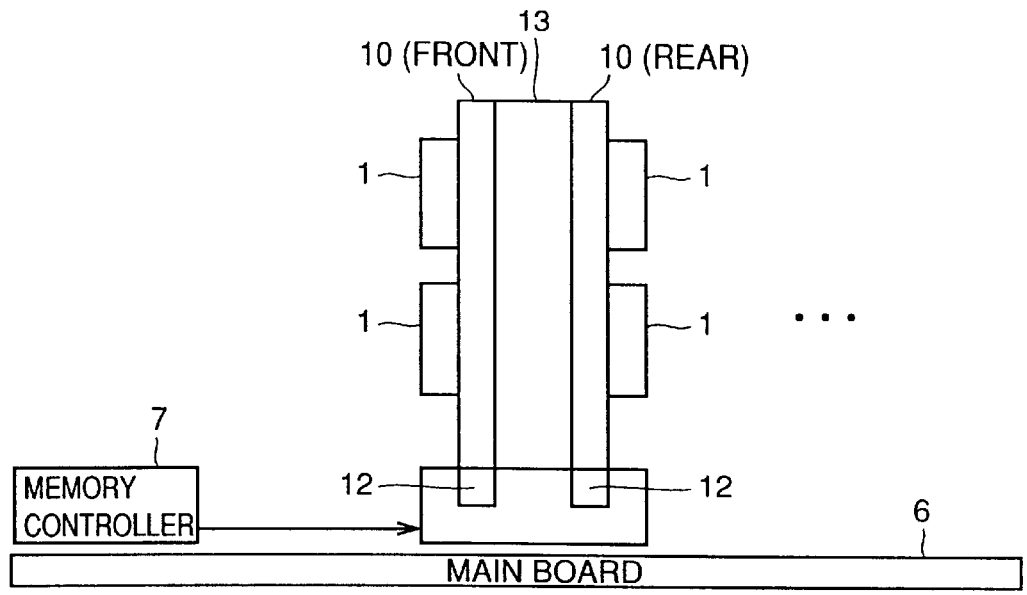
FIG. 4 shows a memory module of the first embodiment of the invention.

Description will now be given on the memory module using the memory chip of the first embodiment of the invention. FIG. 4 shows an appearance of the memory module of the first embodiment of the invention. The memory module of the first embodiment of the invention has a front side and a rear side. A plurality of memory chips indicated by "1" are arranged on a module substrate 10 providing the front and rear sides. The pins of the plurality of memory chips 1 are arranged in the manner already described. The relationship in arrangement between the plurality of memory chips on the front side is the same as that on the rear side. The memory chips are mounted on a main board 6.

A connect pin group 12 arranged in one end of module substrate 10 is connected to a memory controller 7. The data I/O pin groups DP of the memory chips arranged on the front and rear sides are connected to connect pin group 12 via an interconnection layer 13, which is arranged between the front and rear sides. Each memory chip 1 is controlled via main board 6 by memory control 7.

Figure 5:
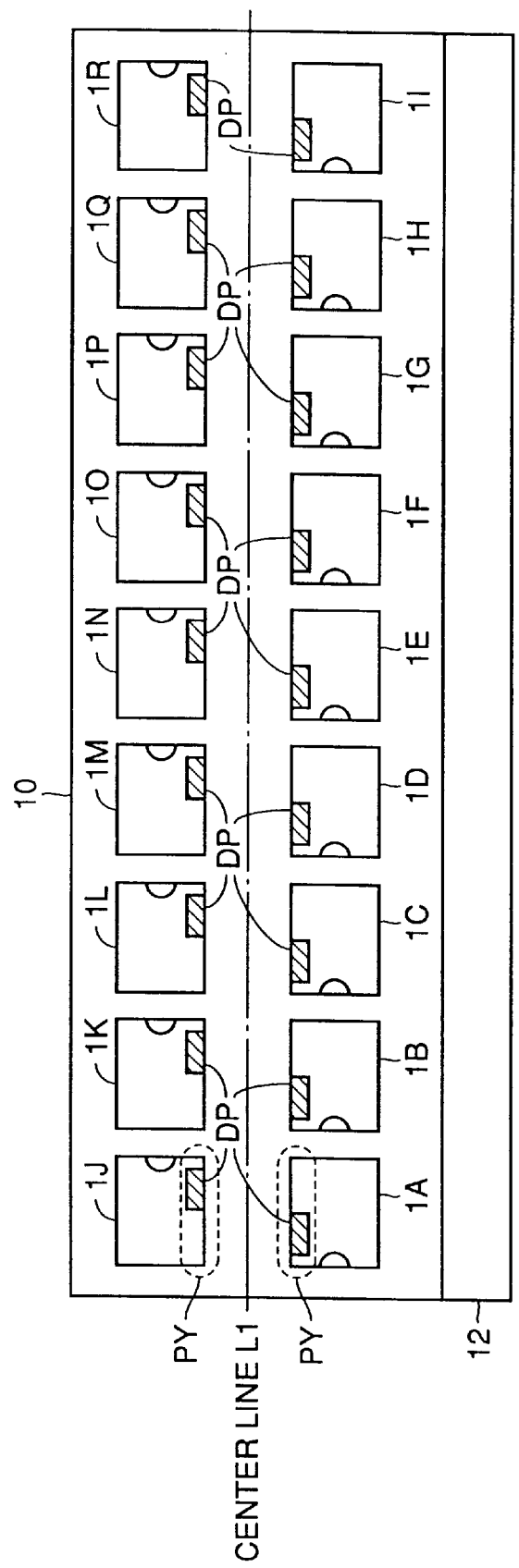
FIG. 5 shows a structure of a front side of the memory module of the first embodiment of the invention.

A specific manner of arranging the memory chips on the memory module shown in FIG. 4 will now be described with reference to FIG. 5. The memory module carries 18 memory chips on each of the front and rear sides, and therefore carries 36 memory chips in total. As shown in FIG. 5, one (e.g., front side) of the surfaces defining the memory module the plurality of carries memory chips 1A–1R. Likewise, the plurality of memory chips (indicated by 1A'–1R', respectively) are arranged on the rear side.

In each of the memory chips 1A–1R and 1A'–1R', data I/O pin group DP (indicated by hatching) is arranged in one end (a portion of pin row PY) of the chip.

The plurality of memory chips are arranged in two rows which are located on the opposite sides of a center line L1 of module substrate 10 parallel to connect pin group 12. More specifically, memory chips 1A–1I as well as memory chips 1J–1R are arranged parallel to center line L1. Each memory chip is angularly positioned such that data I/O pin group DP is nearest to center line L1. In the above arrangement, the memory chips are arranged such that data I/O pin groups DP in one of the rows are opposed to data I/O pin groups on the other row, respectively. The memory chips are arranged in a similar fashion on the rear side.

Figure 6:
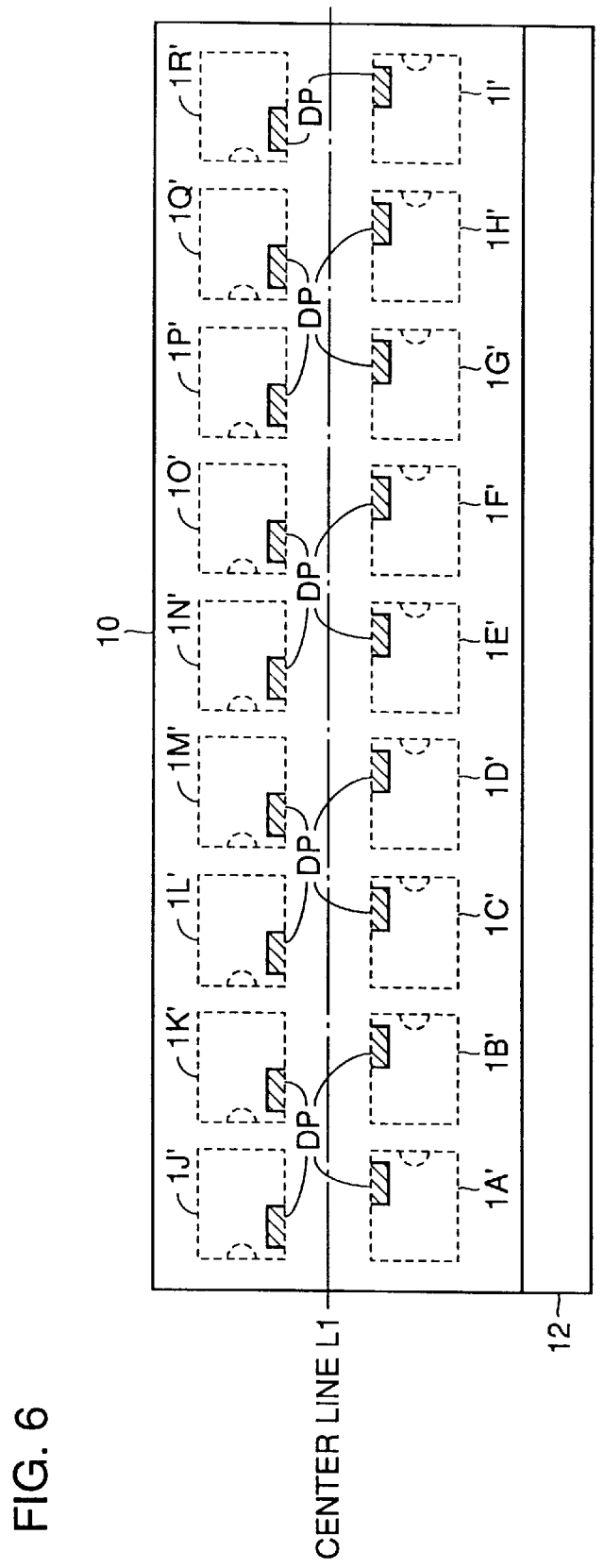
FIG. 6 is an imaginary diagram of a rear side viewed through the front side.

FIG. 6 is an imaginary diagram showing a rear side viewed through the front side and interconnection layer 13. Memory chips 1J'–1R' are located on the rear sides of memory chips 1J–1R, respectively, and memory chips 1A'–1I' are located on the rear sides of memory chips 1A–1I, respectively.

Owing to the above structure, all the memory chips on each of the front and rear sides can have data I/O pin groups DP spaced from center line L1 by the equal distances. Thereby, such a structure can be easily achieved that distances from respective data I/O pin groups DP to connect pin group 12 are substantially equal to each other.

Figure 7:
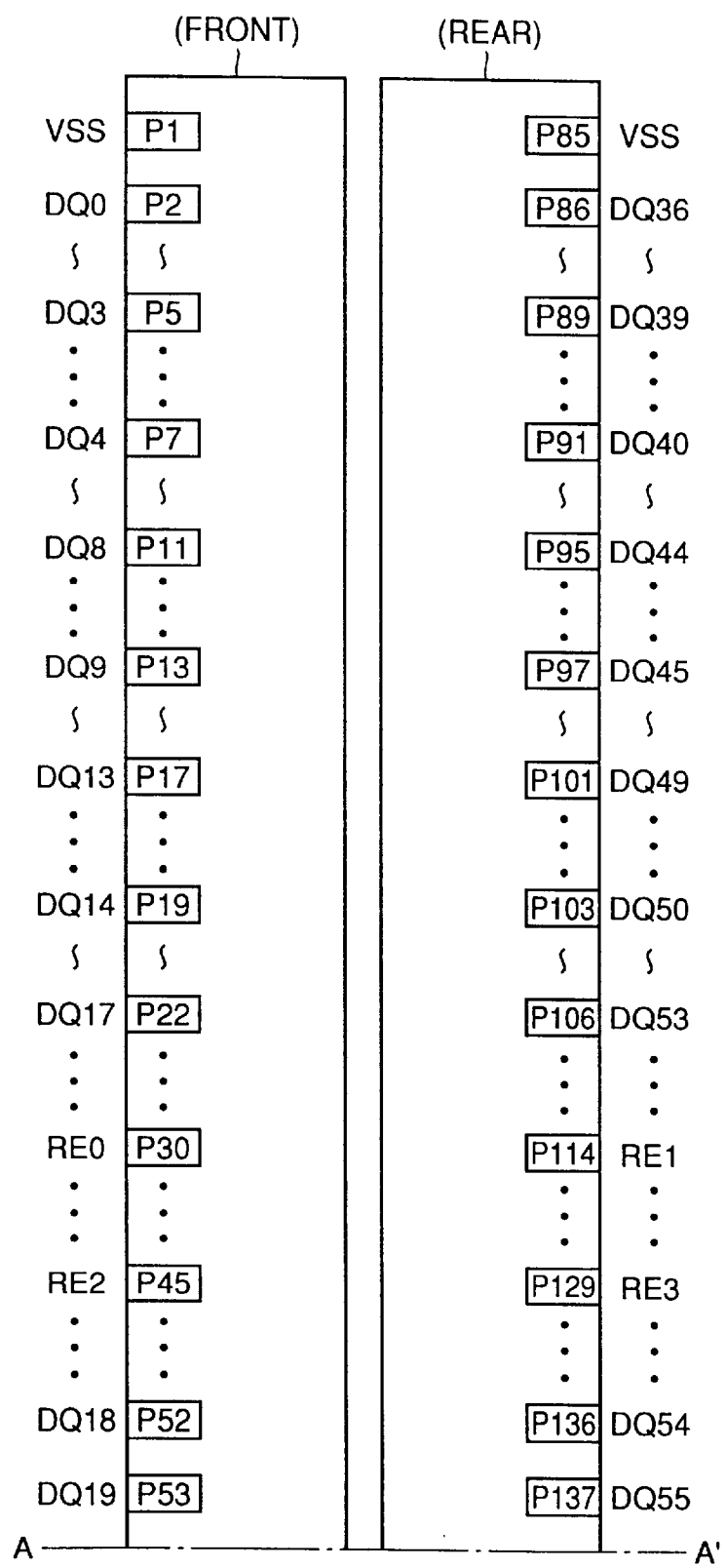
FIG. 7 and FIG. 8 show an arrangement of connect pins of an ECC DRAM memory module.
Figure 8:
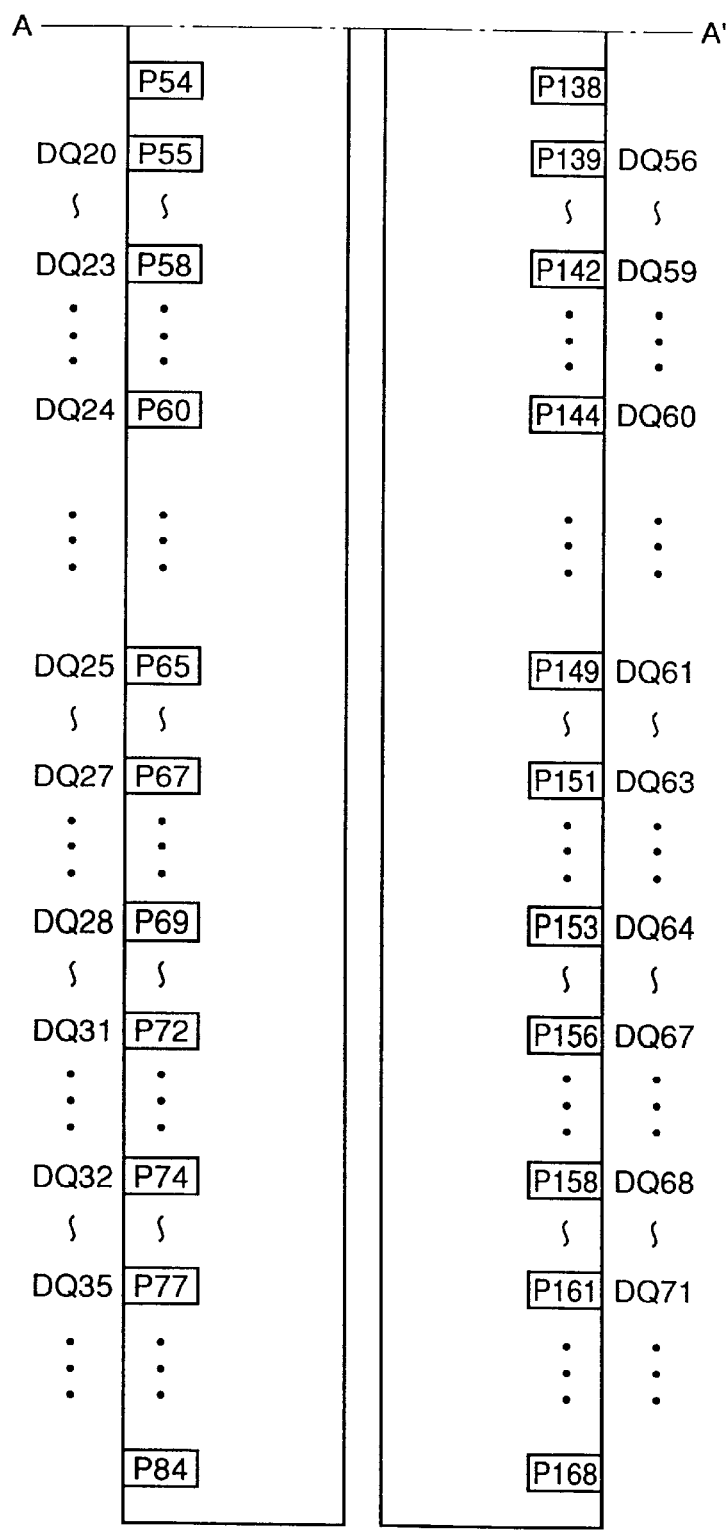

Description will now be given on an example of a memory module carrying DRAMs having memory regions dedicated to error correction, respectively. According to the JEDEC standards, connect pins of the memory module (ECC Mode memory module) employing such memory chips are arranged as shown in FIGS. 7 and 8. The structures in FIGS. 7 and 8 are continuous to each other via an imaginary plane A—A'.

The ECC MODE memory module shown in FIGS. 7 and 8 includes pins of 168 in total number (84 pins on each of the front and rear sides). These pins include 72 data I/O pins DQ0–DQ71 (generally referred to as "data I/O pin group DQ" hereinafter). Data I/O pins DQ0–DQ35 are arranged on the front side. Data I/O pins DQ36–DQ71 are arranged on the rear side and are located in the same positions as corresponding pins DQ0–DQ35 on the front side, respectively.

For example, a 1st pin P1 is provided for a ground power supply VSS, and 2nd to 5th pins P2–P5 are data I/O pins DQ0–DQ3, respectively. An 85th pin P85 (1st pin on the rear side) is provided for ground power supply VSS, and 86th to 89th pins P86–P89 (2nd–5th pins on the rear side) are data I/O pins DQ36–DQ39, respectively.

In addition to the above, address pins, power supply pins, control signal pins and others are included. The pins in the same positions on the front and rear sides receive or issue signals of the same function.

For example, 30th pin P30 is a clock pin RE0, 114th pin P114 is a clock pin RE1, 45th pin P45 is a clock pin RE2 and 129th pin P129 is a clock pin RE3. These clock pins will be collectively referred to as a "clock pin group RE" hereinafter. These clock pins receive row address strobe signal /RAS determining the take-in timing of the row address. In each memory chip, the timing for driving the word lines and the timing for driving sense amplifiers depend on the take-in timing of the row address thus determined.

Figure 9:
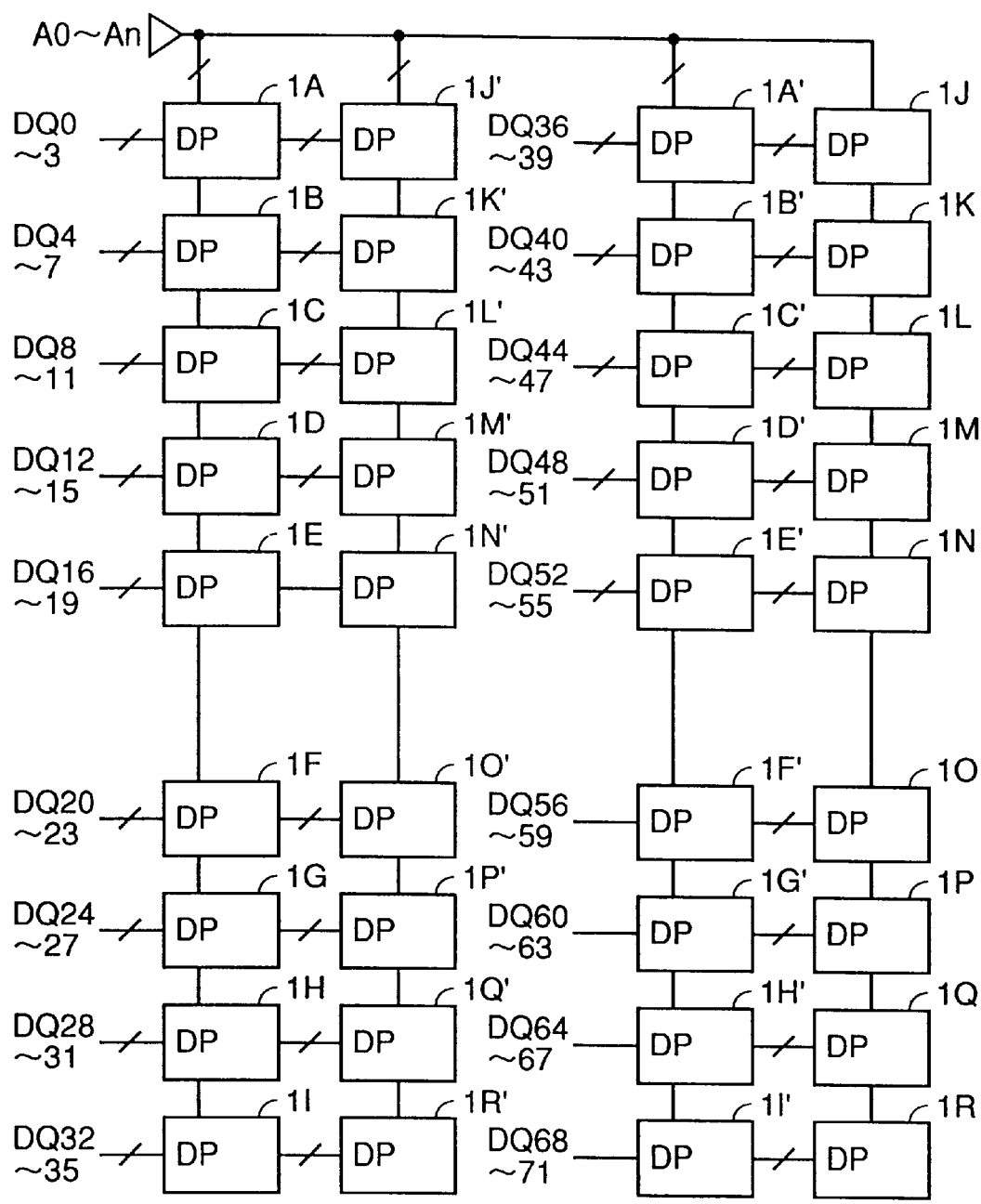
FIG. 9 is a diagram showing a relationship between the connect pins and the respective memory chips.

FIG. 9 shows a relationship between data I/O pin group DQ included in connect pin group 12 and the memory chips on the front and rear sides. For example, memory chip 1A on the front side and memory chip 1J' on the rear side have such connection structures that data I/O pin group DP (D0–D3) of each memory chip is connected to data I/O pins DQ0–DQ3. Likewise, memory chip 1J on the front side and memory chip 1A' on the rear side have such connection structures that data I/O pin group DP (D0–D3) of each memory chip is connected to data I/O pins DQ36–DQ39. Thus, the memory chips which are arranged on the front and rear sides are connected to the same data I/O pin group in the connect pin group.

Figure 10:
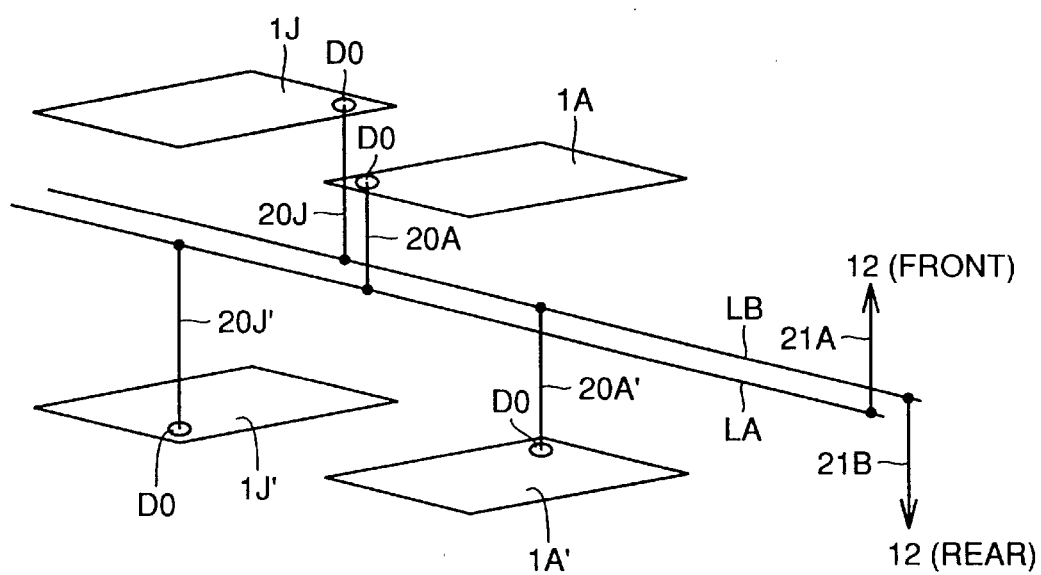
FIG. 10 shows an interconnection relationship between the memory chips and the connect pins.

FIG. 10 shows a schematic connection structure. Data I/O pin D0 of memory chip 1A on the front side and data I/O pin D0 of memory chip 1J' on the rear side are connected to an interconnection LA via through-holes 20A and 20J', respectively. Data I/O pin D0 of memory chip 1J on the front side and data I/O pin D0 of memory chip 1A' on the rear side are connected to an interconnection LB via through-holes 20J and 20A', respectively.

Interconnection LA is connected to data I/O pin DQ0 included in connect pin group 12 on the front side via a through-hole 21A. Interconnection LB is connected to data I/O pin DQ36 included in connect pin group 12 on the rear side via a through-hole 21B.

Figure 11B:
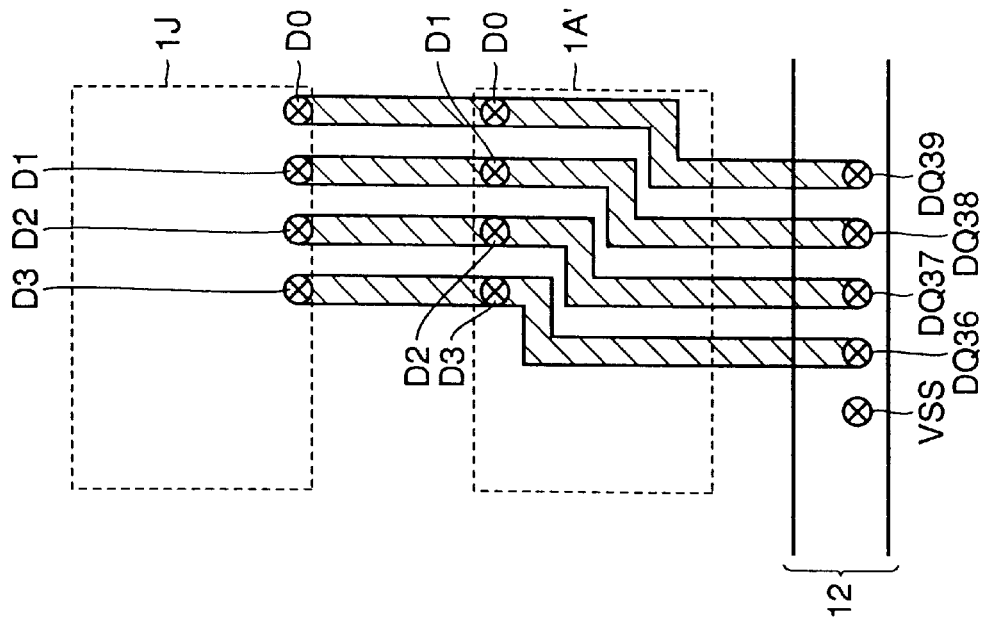
FIGS. 11A and 11B show interconnection patterns formed between the memory chips and the connect pins.
Figure 11A:
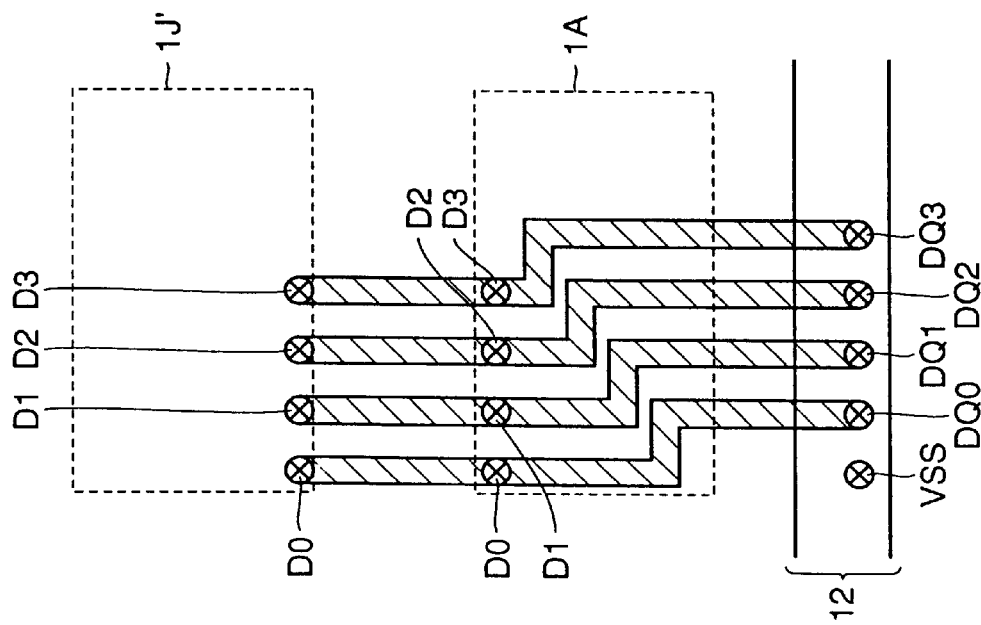

Interconnections LA and LB are included in interconnection layer 13 already described. The structure in which interconnections LA and LB are formed in different layers, respectively, will now be discussed with reference to FIGS. 11A and 11B. In FIGS. 11A and 11B, circle marks represent the through-holes, respectively, and cross marks represent the pin positions, respectively. The interconnection patterns shown in FIGS. 11A and 11B are formed in different layers, respectively.

Memory chips 1J' and 1A are connected to data I/O pins DQ0–DQ3 via the interconnection pattern shown in FIG. 11A. Memory chips 1J and 1A' are connected to data I/O pins DQ36–DQ39 via the interconnection pattern, which is shown in FIG. 11B and has the same configuration as the interconnection pattern hatched in FIG. 11A.

The interconnection lengths are substantially equal to each other.

According to the first embodiment of the invention, all the data I/O pins of the memory chip are arranged on one side surface (on the same line) of package 1. Therefore, interconnections of the substantially equal lengths can be employed between the connect pins of the memory module and the respective memory chips without bending the interconnections into complicated forms. Therefore, the data transfer can be performed efficiently without lowering the operation performance of the respective memory chips. Further, the JEDEC standards can be satisfied.

[Second Embodiment]

Figure 12:
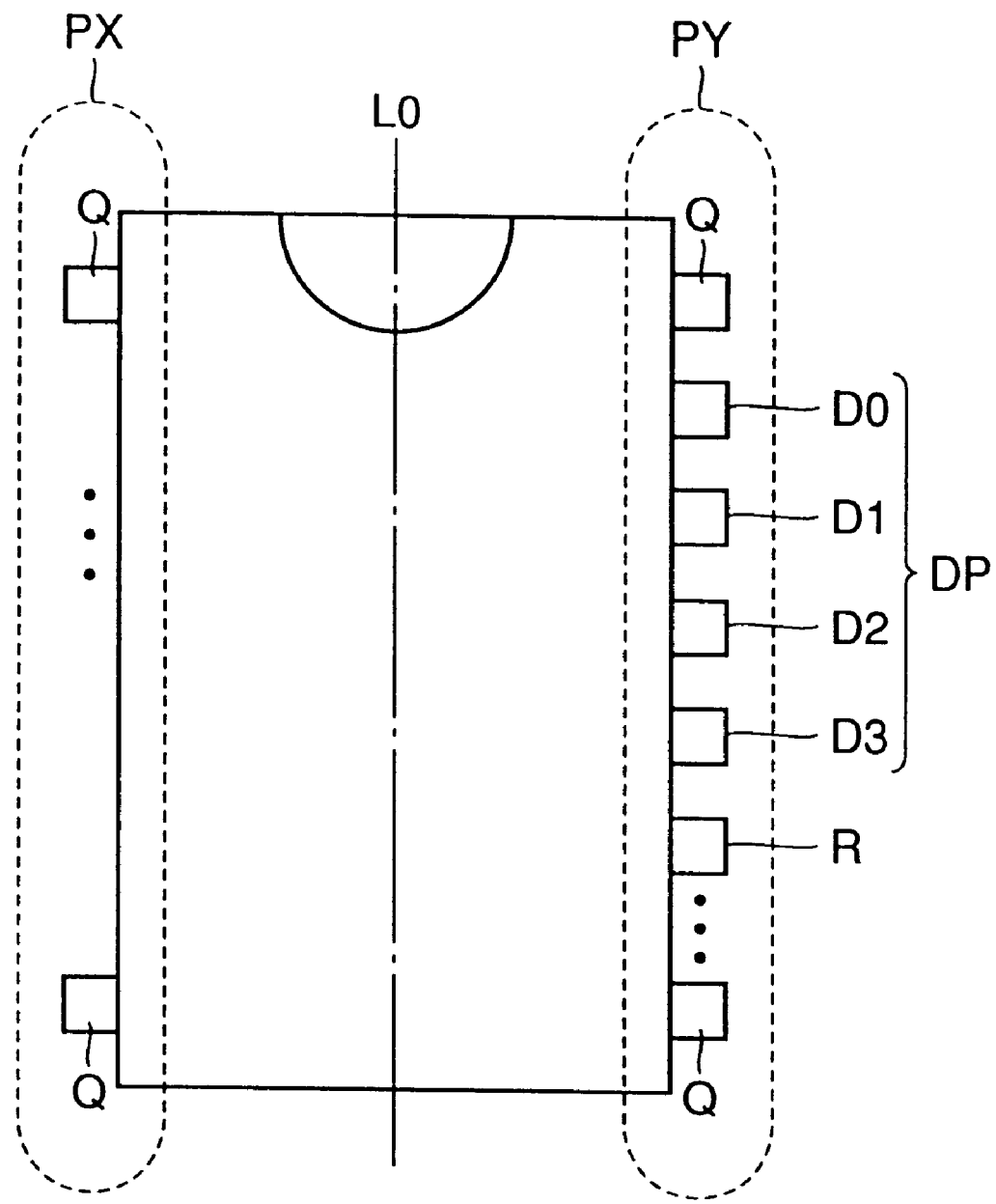
FIG. 12 shows an arrangement of pins of a memory chip of a second embodiment of the invention.

A memory chip of a second embodiment of the invention will now be described with reference to FIG. 12. In the memory chip of the second embodiment of the invention, as shown in FIG. 12, data I/O pin group DP and a pin (clock pin) R receiving a specific signal are arranged on the same side surface. Clock pin R is, e.g., a pin receiving row address strobe signal /RAS, and is connected to clock pins RE0–RE3 described above.

In the example shown in FIG. 12, the plurality of pins are arranged on each of the opposite sides of the chip. This facilitates use of a thin small outline package TSOP, in which pin rows PX and PY are arranged symmetrically with respect to the center line L0, and are located on the two sides (two side surfaces) opposed to each other, respectively. All the data I/O pins and the pin (clock pin) R receiving the specific signal are arranged on the one side surface.

The memory chip shown in FIG. 12 is the foregoing DRAM, i.e., the DRAM with the EDO mode.

Figure 13:
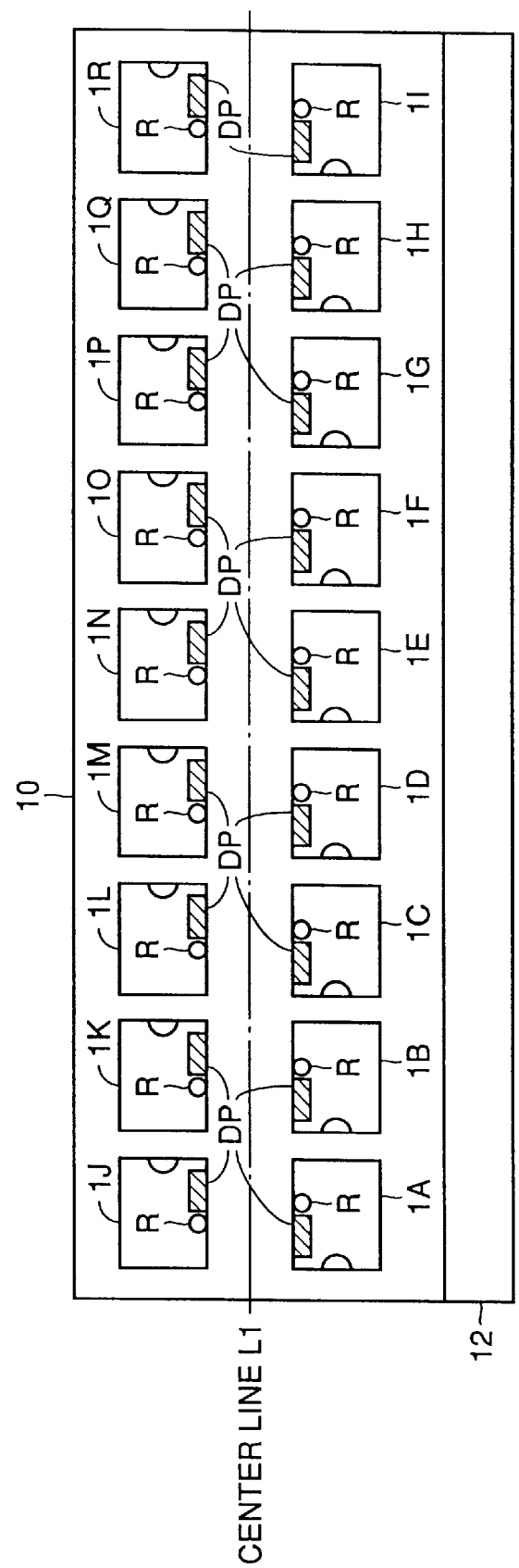
FIG. 13 shows a structure of a front side of a memory module of the second embodiment of the invention.

Description will now be given on the memory module using the memory chips of the second embodiment of the invention with reference to FIG. 13. The memory module is provided on each of its front and rear sides with 18 memory chips, and therefore includes the 36 memory chip in total. As shown in FIG. 13, a plurality of memory chips 1A–1R are arranged on one (e.g., front side) of the surfaces defining the memory module. Likewise, a plurality of memory chips indicated by 1A'–1R' are arranged on the rear side.

Data I/O pin group DP and clock pin R of each of memory chips 1A–1R and 1A'–1R' are arranged in one side (a portion of pin row PY) of the chip as already described with reference to FIG. 12.

The plurality of memory chips are arranged in two rows parallel to connect pin group 12. More specifically, memory chips 1A–1I and memory chips 1J–1R arranged in two parallel rows are located on the opposite sides of center line L1 of the module substrate, respectively. Each memory chip is angularly positioned such that data I/O pin group DP and clock pin R are nearest to center line L1. In this arrangement, the memory chips are arranged such that data I/O pin groups DP and clock pins R in one of the rows are opposed to data I/O pin groups and clock pins R on the other row, respectively. The memory chips are arranged in a similar fashion on the rear side.

Figure 14:
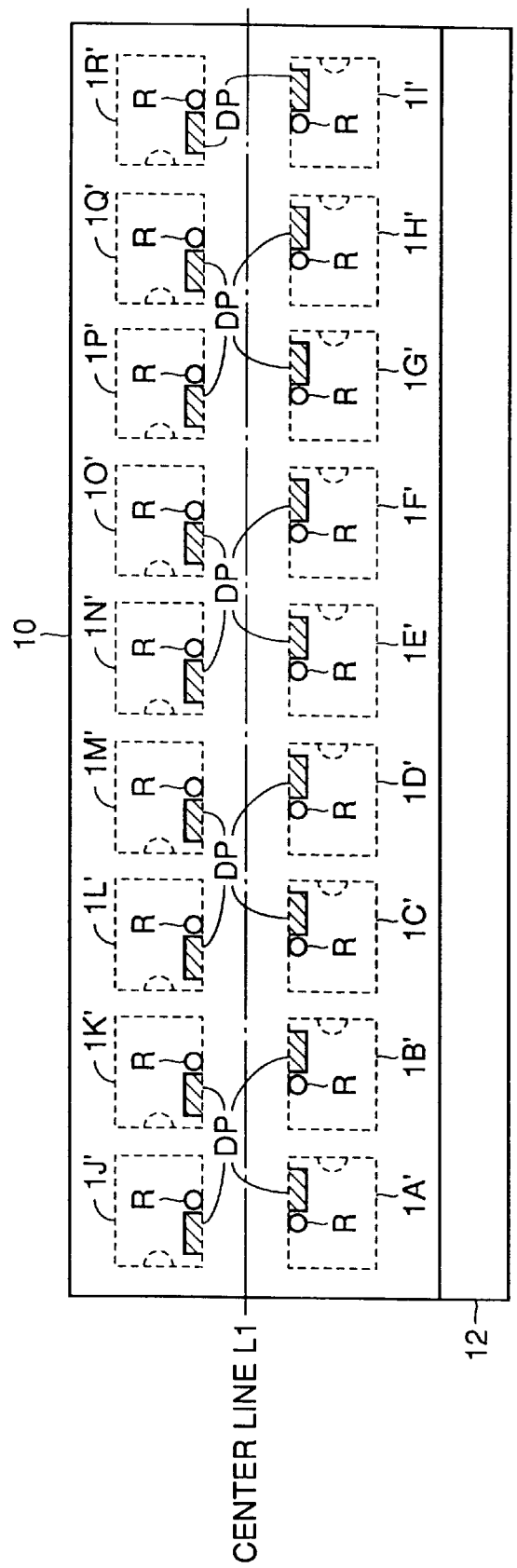
FIG. 14 is an imaginary diagram of a rear side viewed through the front side.

FIG. 14 is an imaginary diagram of the rear side viewed through the front side. Memory chips 1J'–1R' are located on the rear side, and are opposed to memory chips 1J–1R, respectively. Memory chips 1A'–1I' are located on the rear side, and are opposed to memory chips 1A–1I, respectively.

Owing to the above structure, all the memory chips on each of the front and rear sides can have data I/O pin groups DP and clock pins R spaced from center line L1 by the equal distances. Thereby, such a structure can be easily achieved that distances from respective data I/O pin groups DP to connect pin group 12 are substantially equal to each other, and distances from clock pins R to connect pin group 12 are substantially equal to each other.

An example of the ECC (error checking and correcting) MODE memory module will now be described. Data I/O pin groups DQ and clock pin groups RE included in connect pin group 12 have a relationship shown in FIG. 15 with respect to the memory chips on the front and rear sides.

Figure 15:
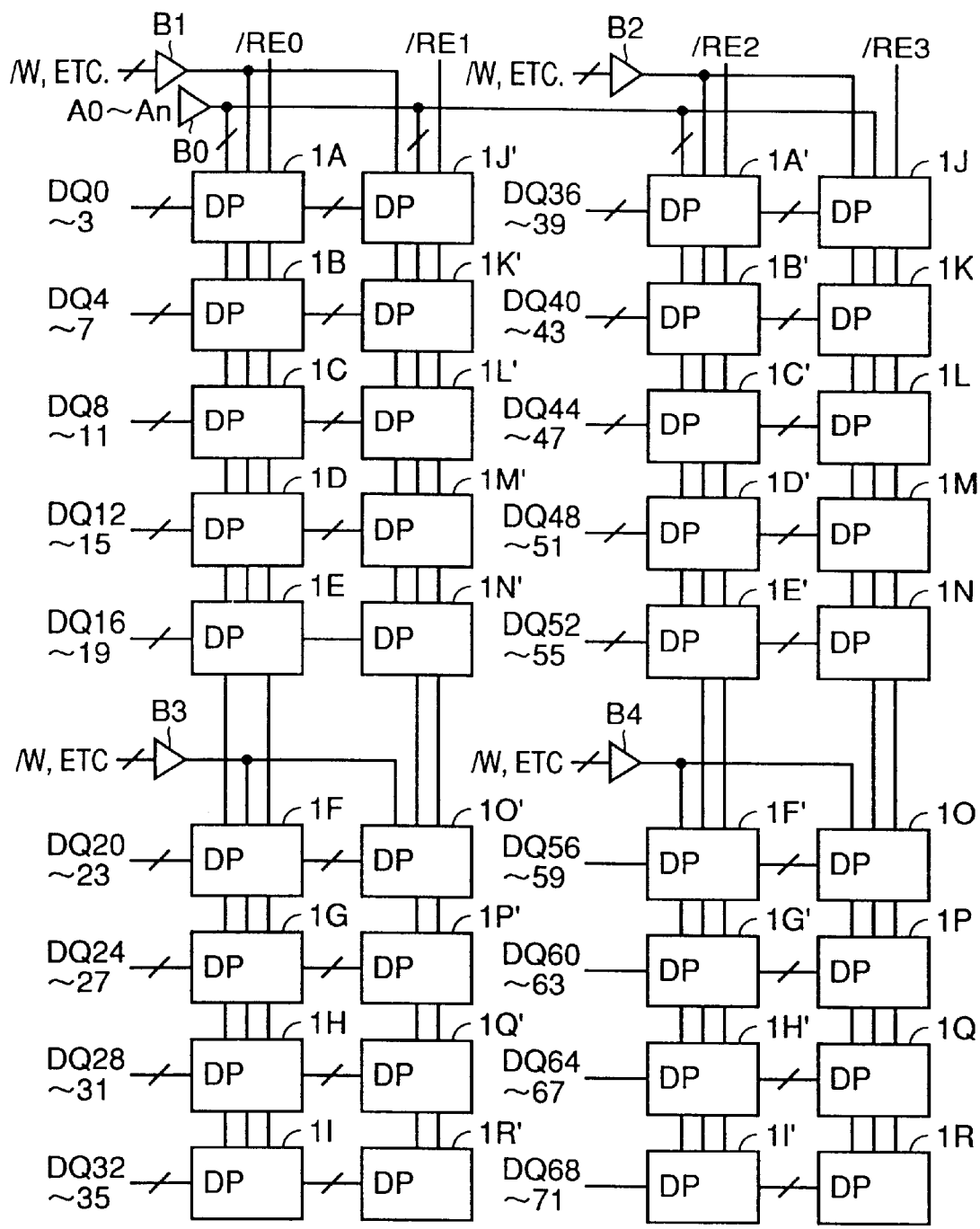
FIG. 15 is a diagram showing a relationship between the connect pins and the respective memory chips.

In FIG. 15, characters /RE0, /RE1, /RE2 and /RE3 represent clock signals (row address strobe signals) to be received on clock pins RE0, RE1, RE2 and RE3, respectively. A character /W and others represent various signals including a write enable signal for data writing.

Address signals A0–An and control signals including signal /W are taken into the respective memory chips via the corresponding connect pins and buffers B0–B4. Clock pins RE0, RE1, RE2 and RE3 are connected to corresponding clock pins R of the corresponding memory chips without interposing a buffer therebetween, respectively.

Clock signal /RE0 is directly taken into memory chips 1A–1I on the front side, and clock signal /RE3 is directly taken into memory chips 1J to 1R on the front side. Clock signal /RE1 is directly taken into memory chips 1J'–1R' on the rear side, and clock signal /RE2 is directly taken into memory chips 1A'–1I' on the rear side.

The relationship of data I/O pins D0–D3 of each memory chip with respect to data I/O pins DQ0–DQ71 is the same as that of the first embodiment.

The timing according to which the signals are taken into the memory chip via the buffer primarily depends on the buffer. For clock signals /RE0, RE1, RE2 and /RE3 which are taken into the memory chips without passing through the buffer, the take-in timing primarily depends on a relationship in distance between the respective clock pins in connect pin group 12 and the clock pins in the respective memory chips.

As described above, all the data I/O pins and clock pin R of the memory chip are arranged on the one side surface of the package, and the memory chip is angularly positioned such that these data I/O pins and clock pin R are nearest to center line L1. Thereby, interconnections of the equal lengths can be employed for the data I/O pins and the specific pin, which does not use the buffer for receiving the signal, without bending the interconnections into complicated forms. Therefore, the take-in of signals via the specific pins in the respective memory chips can be performed in accordance with constant timing. Further, the JEDEC standards can be satisfied.

[Third Embodiment]

Figure 16:
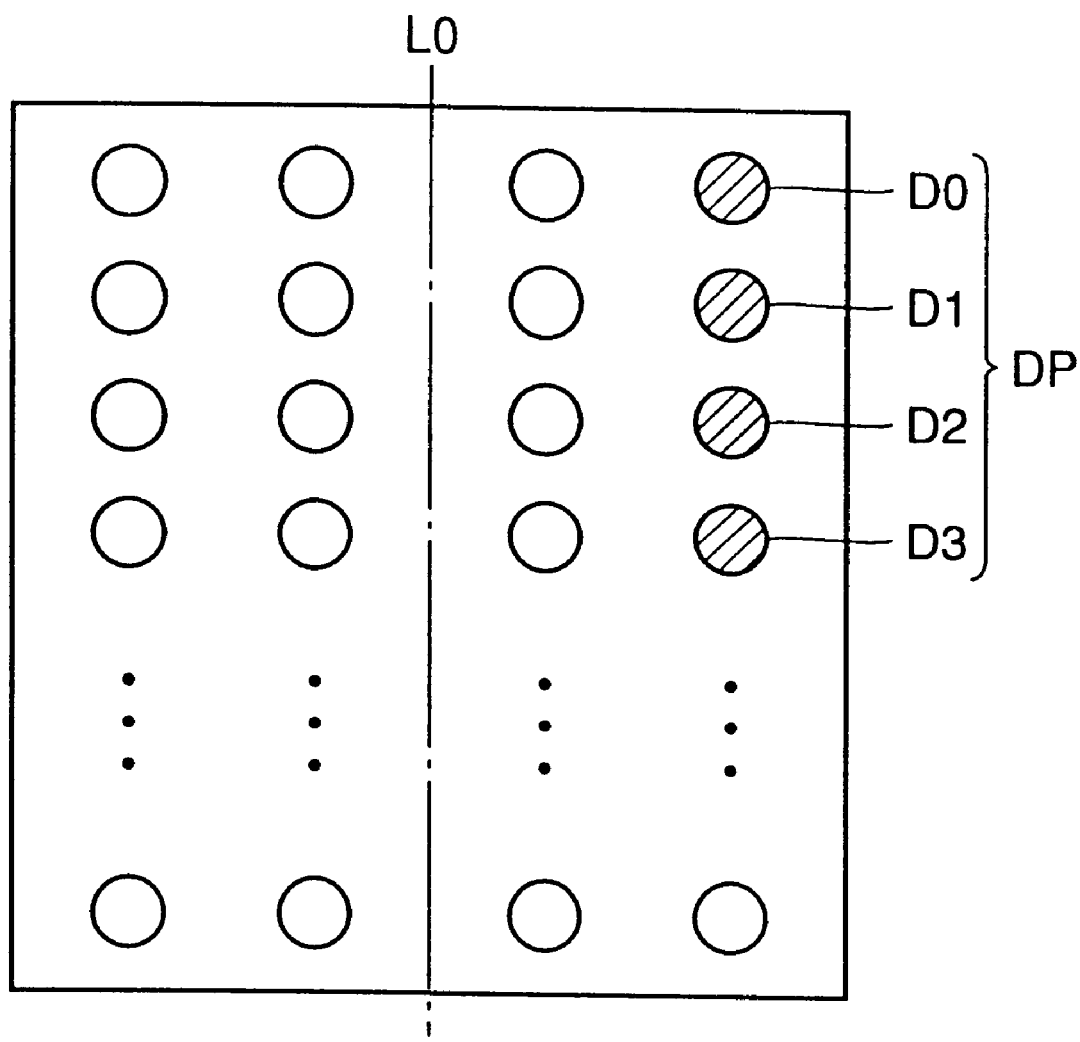
FIG. 16 is a diagram showing an arrangement of pins of a memory chip of a third embodiment of the invention.

A memory chip of a third embodiment of the invention will now be described with reference to FIG. 16. As shown in FIG. 16, a chip scale package CSP is used as a package for the memory chip of the third embodiment of the invention. The package is provided at its surface with solder poles represented by circles in the figure, and is directly connected to the substrate by flip chip bonding.

In the third embodiment of the invention, the plurality of solder poles are divided into a plurality of rows which are arranged parallel to center line L0 of the package. In this structure, the four solder poles in the outermost row are determined to correspond to data I/O pins D0, D1, D2 and D3, respectively, which will be simply referred to as data I/O pin group DP hereinafter. The other solder poles are used for receiving the control signals, address signals, power supply voltage and others. Thus, all the data I/O pins are arranged near one side of the outer periphery defining the surface of the package. The memory chip is a DRAM, a DRAM with an EDO mode, an SDRAM or the like as already described in connection with the first embodiment.

Figure 17:
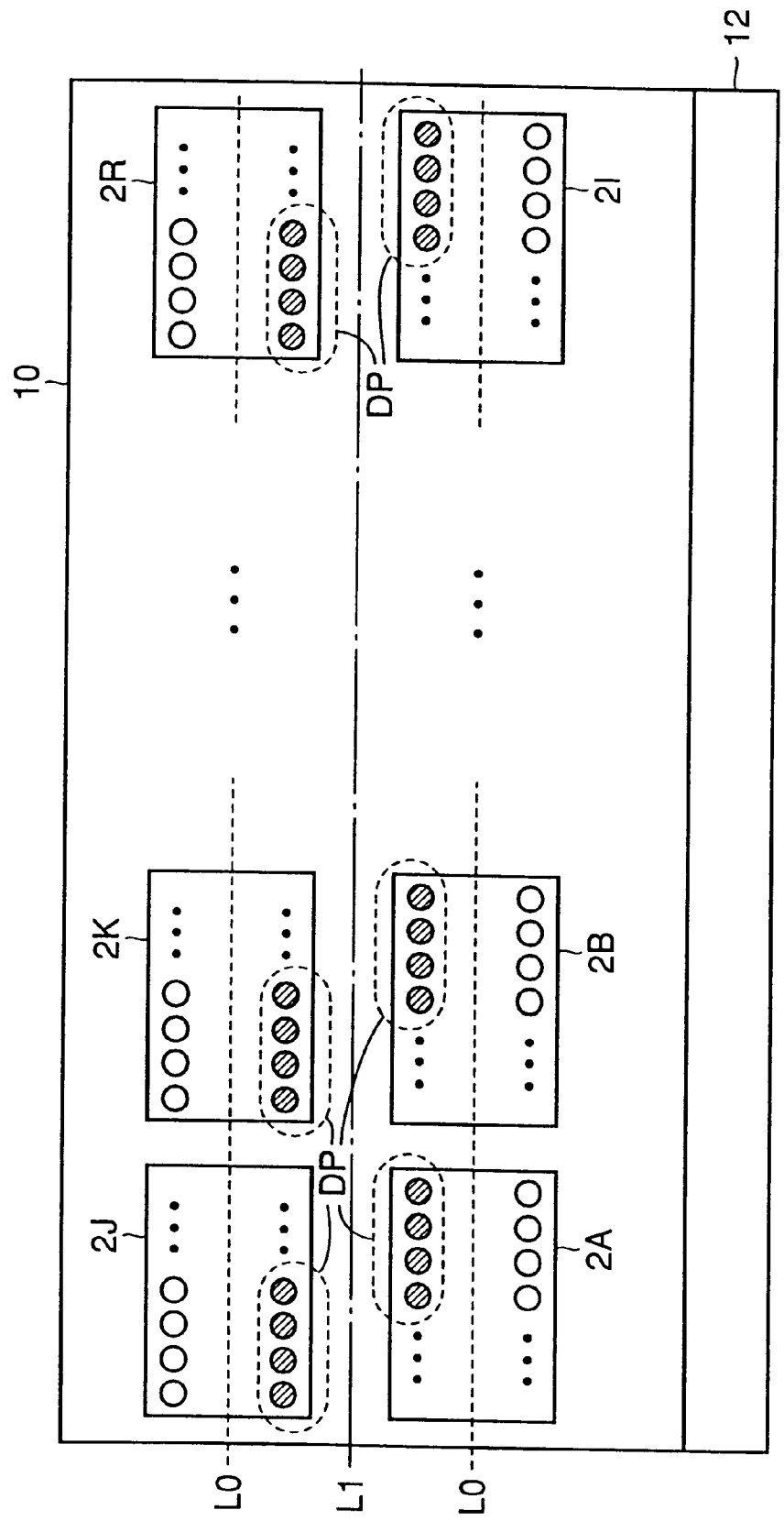
FIG. 17 shows a structure of a memory module of the third embodiment of the invention.

The memory module using the above memory chips will now be described with reference to FIG. 17. The memory module carries 18 memory chips on each of the front and rear sides, and therefore carries the 36 memory chips in total. As shown in FIG. 17, a plurality of memory chips 2A–2R are arranged on one (e.g., front side) of the surfaces defining the memory module. On the rear side, a plurality of memory chips indicated by 2A'–2R' are arranged in a similar fashion. Memory chips 2A–2R and 2A'–2R' have pins (solder poles) having the same pin structures as those already described with reference to FIG. 16.

The plurality of memory chips are arranged in two rows parallel to connect pin group 12. More specifically, memory chips 2A–2I and memory chips 2J–2R are arranged on the opposite sides of center line L1 of module substrate 10 parallel to connect pin group 12. Each memory chip is arranged such that data I/O pin group DP is nearest to center line L1. In this case, the memory chips are arranged such that data I/O pin groups DP in one of the rows are opposed to those in the other row, respectively. On the rear side, the memory chips are arranged in a similar fashion.

Owing to the above structure, all the memory chips on each of the front and rear sides are arranged such that all the data I/O pin groups DP are spaced by equal distances from center line L1. Thus, such a structure can be easily achieved that distances from respective data I/O pin groups DP to connect pin group 12 are substantially equal to each other.

Accordingly, interconnections of the substantially equal lengths can be employed between the data I/O pins of the memory chips and the data I/O pins among the connect pins without bending the interconnections into complicated forms. Thereby, the JEDEC standards can be satisfied. Further, data I/O pin group DP and a specific pin (clock pin R) may be arranged on the same side surface, whereby interconnections of the substantially equal lengths can be employed between the specific pins of the respective memory chips and the connect pins without bending the interconnections into complicated forms.

[Fourth Embodiment]

Figure 18:
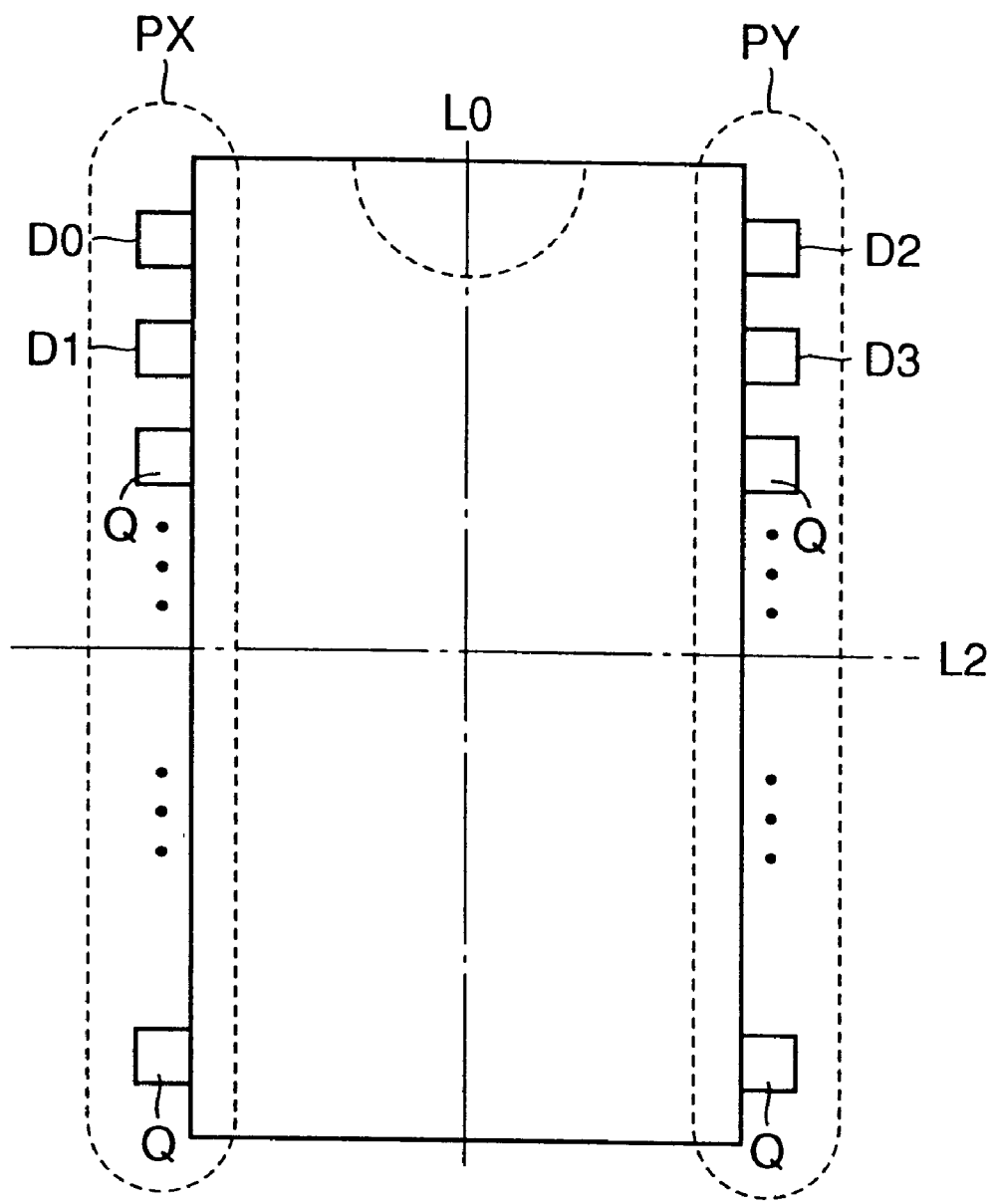
FIG. 18 is a diagram showing an arrangement of pins of a memory chip of a fourth embodiment of the invention.

A memory chip of a fourth embodiment of the invention will now be described with reference to FIG. 18. As shown in FIG. 18, the memory chip of the fourth embodiment of the invention uses a thin small outline package TSOP, in which a plurality of pins are arranged on the opposite sides of the memory chip.

Data I/O pins are gathered in positions spaced from a center line L2 of the memory chip which is perpendicular to the row of pins. It is assumed in FIG. 18 that two pins at the end and the subsequent position in pin row PX are data I/O pins D0 and D1, respectively, two pins at the end and the subsequent position in pin row PY are data I/O pins D2 and D3. The memory chip is a DRAM, a DRAM with a EDO mode, an SDRAM or the like as already described in connection with the first embodiment.

Figure 19:
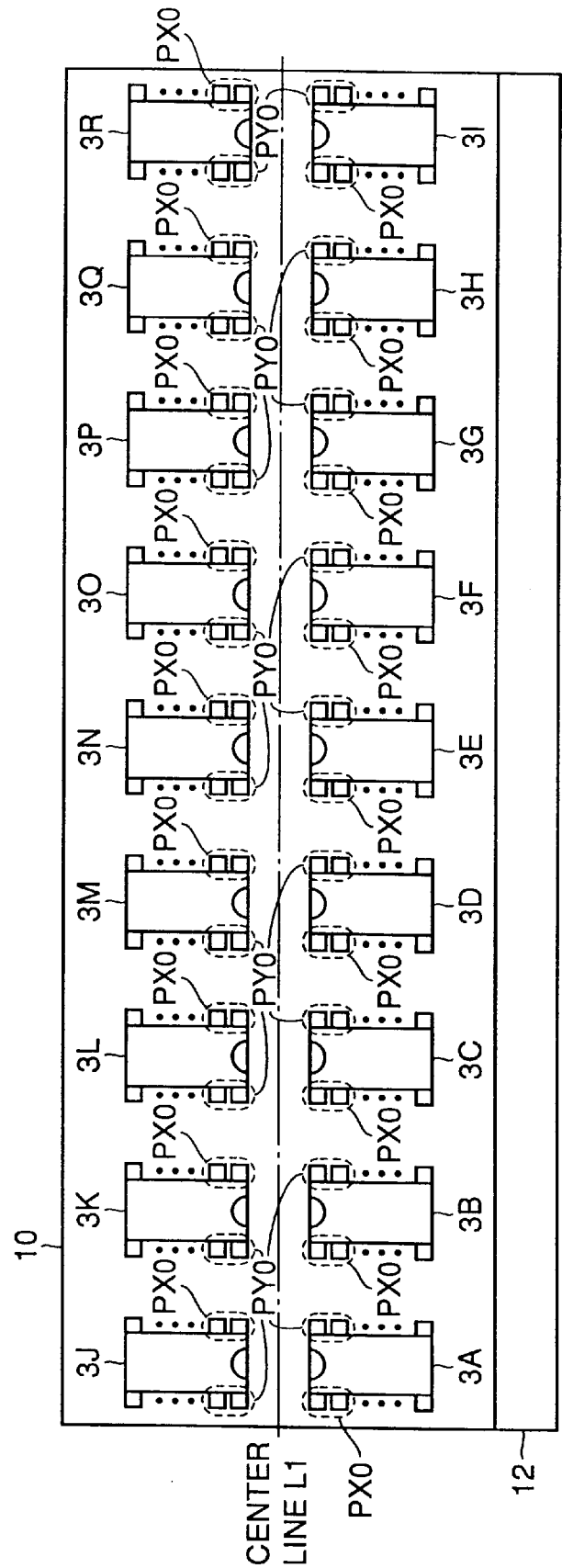
FIG. 19 shows a structure of a memory module of the fourth embodiment of the invention.
Figure 20:
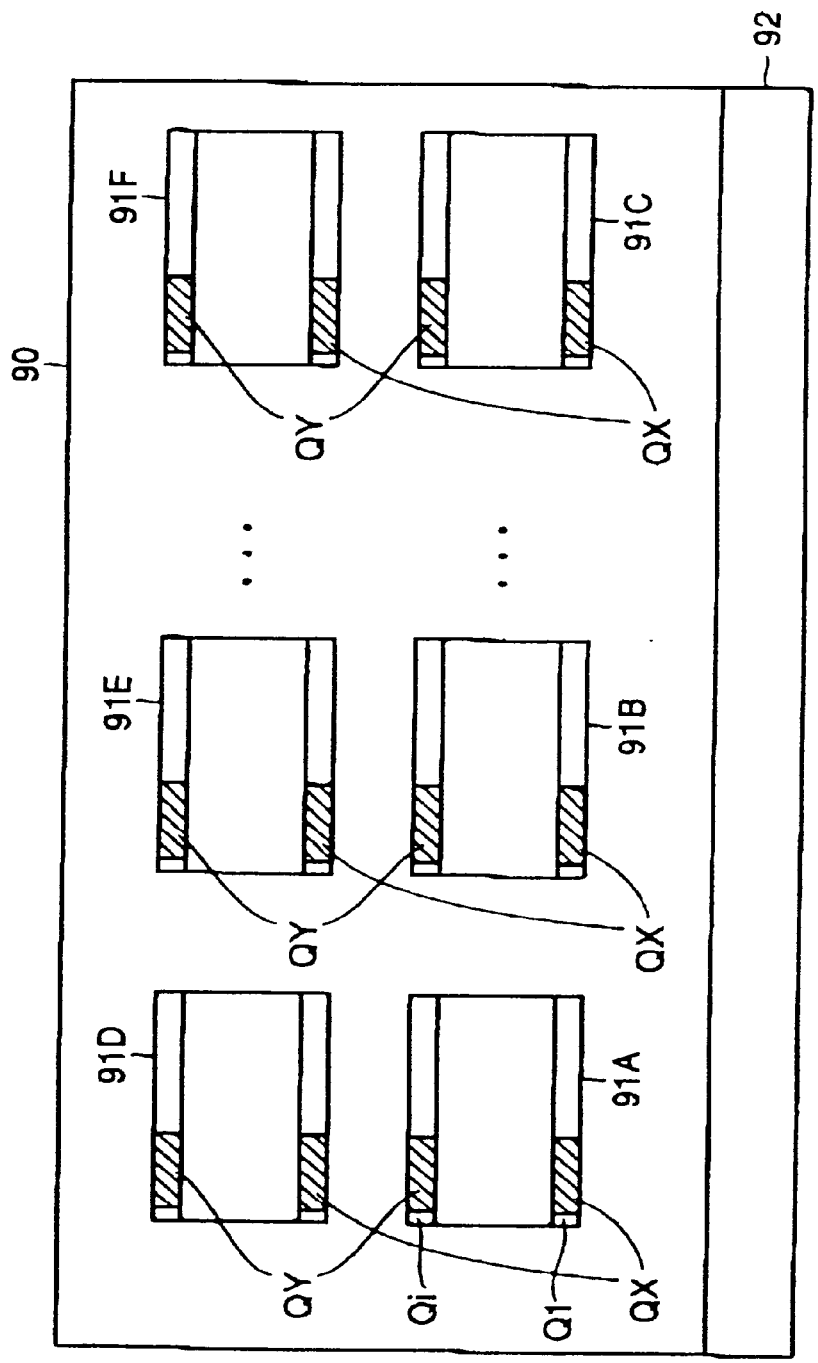
FIG. 20 shows a conventional memory module.

The memory module using the above memory chips will now be described with reference to FIG. 19. The memory module carries 18 memory chips on each of the front and rear sides, and therefore carries the 36 memory chips in total. As shown in FIG. 19, a plurality of memory chips 3A–3R are arranged on one (e.g., front side) of the surfaces defining the memory module. On the rear side, a plurality of memory chips indicated by 3A'–3R' are arranged in a similar fashion. Memory chips 3A–3R and 3A'–3R' have the pin structures already described with reference to FIG. 18. In FIG. 19, characters "PX0" represent data I/O pins D0 and D1, and characters "PY0" resent data I/O pins D2 and D3.

The plurality of memory chips are arranged in two rows located on the opposite sides of center line L1 of module substrate 10 parallel to connect pin group 12. More specifically, memory chips 3A–3I and memory chips 3J–3R are arranged parallel to center line L1. Each memory chip is arranged such that data I/O pin group DP is nearest to center line L1. In this case, the memory chips are arranged such that data I/O pin groups DP in one of the rows are opposed to those in the other row, respectively. On the rear side, the memory chips are arranged in a similar fashion.

Owing to the above structure, all the memory chips on each of the front and rear sides are arranged such that all the data I/O pin groups DP are spaced by equal distances from center line L1. Thus, such a structure can be easily achieved that distances from respective data I/O pin groups DP to connect pin group 12 are substantially equal to each other.

Accordingly, interconnections of the equal lengths can be employed between the memory chips and the connect pins without bending the interconnections into complicated forms, as can be done also in the first embodiment, and the JEDEC standards can be satisfied.

Further, data I/O pin group DP and the specific pin (clock pin R) may be arranged on the same side, whereby interconnections of the equal lengths can be employed between the specific pins of the respective memory chips and the connect pins without bending the interconnections into complicated forms.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell array including a plurality of memory cells arranged in rows and columns;
   an internal circuit for writing data into said memory cell array or reading data from said memory cell array; and
   a rectangular-shaped package comprising two longer sides and two shorter sides, said package including a plurality of pins and surrounding said memory cell array and said internal circuit, wherein
      said plurality of pins are arranged on the two longer sides of the rectangle forming said package;
      said plurality of pins include a plurality of data input/output pins for externally receiving the data to be written into said memory cell array and externally sending the data read from said memory cell array, and
      said plurality of data input/output pins are all arranged on one of said two longer sides.

2. The semiconductor device according to claim 1, wherein
   said plurality of pins further include a plurality of signal pins disposed on a longer side of the rectangle opposed to the longer side of the rectangle carrying all of said plurality of data input/output pins for externally transmitting signals with respect to said internal circuit.

3. The semiconductor device according to claim 1, wherein
   said package is a thin small outline package.

4. The semiconductor device according to claim 1, wherein
   said plurality of pins further include a control pin receiving a signal controlling a predetermined operation of said internal circuit, and the control pin is arranged on the longer side of the rectangle carrying all of said plurality of data input/output pins.

5. The semiconductor device according to claim 4, wherein
   said package transmits signals to and from a plurality of connect pins arranged on a module substrate carrying said package, and
   said control pin is directly connected to a specific connect pin among said plurality of connect pins.

6. A semiconductor device comprising:
   a semiconductor chip including
      a memory cell array including a plurality of memory cells arranged in rows and columns; and
      an internal circuit for writing data into said memory cell array or reading data from said memory cell array;
   said semiconductor device further comprising:
      a package including a plurality of data input/output pins for externally receiving the data to be written into said memory cell array and externally sending the data read from said memory cell array, and surrounding said semiconductor chip, wherein
         all data input/output pins of the package are clustered on a portion of one surface of said package opposing a surface of said semiconductor chip.

7. The semiconductor device according to claim 6, wherein said package is a chip scale package, and said plurality of data input/output pins are all arranged substantially on the same line.

8. A memory module comprising:

a connect pin group including a plurality of connect pins for externally transmitting signals;

a plurality of memory chips operated by transmission of the signals with respect to said connect pin group; and a module substrate provided with said connect pin group, wherein each of said plurality of memory chips includes:

a memory cell array including a plurality of memory cells arranged in rows and columns, an internal circuit for writing data into said memory cell array or reading data from said memory cell array, and a package including a plurality of data input/output pins for externally receiving the data to be written into said memory cell array and externally sending the data read from said memory cell array, and surrounding said memory cell array and said internal circuit, said plurality of data input/output pins are all arranged on a predetermined surface of said package or in a portion neighboring to said predetermined surface and located in a surface in contact with said predetermined surface, said plurality of memory chips are divided into first and second chip rows for arrangement, and each of said plurality of memory chips is arranged such that said predetermined surface in said first row is opposed to said predetermined surface in said second chip row.

9. The memory module according to claim 8, wherein said first and second chip rows are parallel to said connect pin group.

10. The memory module according to claim 9, wherein said package is a thin small outline package, and said plurality of data input/output pins are all arranged on said predetermined surface.

11. The memory module according to claim 9, wherein said package further includes a control pin arranged on said predetermined surface for receiving a signal controlling a predetermined operation of said internal circuit, and said control pin is directly connected to a specific connect pin among said plurality of connect pins.

12. The memory module according to claim 9, wherein said package is a chip scale package, and said plurality of data input/output pins are all arranged on substantially the same line neighboring to said predetermined surface and located in a surface in contact with said predetermined surface.

13. The memory module according to claim 9, wherein said plurality of data input/output pins are divided for arrangement in said portion neighboring to said predetermined surface and located in a first surface in contact with said predetermined surface and arrangement in said portion neighboring to said predetermined surface and located in a second surface in contact with said predetermined surface.

14. The memory module according to claim 13, wherein said package is a thin small outline package.

* * * * *